(12) United States Patent
Philipp et al.

(10) Patent No.: US 7,615,770 B2
(45) Date of Patent: Nov. 10, 2009

(54) INTEGRATED CIRCUIT HAVING AN INSULATED MEMORY

(75) Inventors: Jan Boris Philipp, Peekskill, NY (US);
Thomas Happ, Tarrytown, NY (US);
Renate Bergmann, Yorktown Heights, NY (US)

(73) Assignee: Infineon Technologies AG, Neubiberg (DE)

( * ) Notice: Subject to any disclaimer, the term of this patent is extended or adjusted under 35 U.S.C. 154(b) by 437 days.

(21) Appl. No.: 11/260,346

(22) Filed: Oct. 27, 2005

(65) Prior Publication Data

US 2007/0096248 A1 May 3, 2007

(51) Int. Cl.
*H01L 47/00* (2006.01)
(52) U.S. Cl. .................. 257/2; 257/4; 257/E21.003
(58) Field of Classification Search .............. 257/2, 257/4
See application file for complete search history.

(56) References Cited

U.S. PATENT DOCUMENTS

| 6,674,115 | B2 | 1/2004 | Hudgens et al. |
| 6,815,704 | B1 * | 11/2004 | Chen .......................... 257/2 |
| 6,838,692 | B1 | 1/2005 | Lung |
| 2003/0164515 | A1 | 9/2003 | Xu |
| 2005/0051901 | A1 | 3/2005 | Chen |
| 2005/0112896 | A1 | 5/2005 | Hamann et al. |

OTHER PUBLICATIONS

S. Lai, T. Lowrey, "OUM—A 180 nm Nonvolatile Memory Cell Element Technology For Stand Alone and Embedded Applications", IEDM 2001.
S. Lai, "Current status of the phase change memory and its future", IEDM 2003.
Y.H. Ha et al., "An Edge Contact Type Cell for Phase Change RAM Featuring Very Low Power Consumption", VLSI, 2003.
ECD Ovonics, Research Report, Ovonic Unified Memory, 1999.
H. Horii et al., "A Novel Cell Technology Using N-doped GeSbTe Films for Phase Change RAM", VLSI, 2003.
Y.N. Hwang et al., "Full Integration and Reliability Evaluation of Phase-change RAM Based on 0.24μm-CMOS Technologies", VLSI, 2003.
C.W. Jeong, "Switching Current Scaling and Reliability Evaluation in PRAM", NVSMW 2004.
F. Pellizzer et al., "Novel μTrench Phase-Change Memory Cell for Embedded and Stand-Alone Non-Volatile Memory Applications", VLSI, 2004.
M.H.R. Lankhorst, et al., "Low-cost and nanoscale non-volatile memory concept for future silicon chips", Nature Materials, published online Mar. 13, 2005.

* cited by examiner

*Primary Examiner*—Jack Chen
(74) *Attorney, Agent, or Firm*—Dicke, Billig & Czaja, PLLC

(57) ABSTRACT

A memory cell includes a first electrode, a second electrode, and phase-change material between the first electrode and the second electrode. The phase-change material defines a narrow region. The memory cell includes first insulation material having a first thermal conductivity and contacting the phase-change material. A maximum thickness of the first insulation material contacts the narrow region. The memory cell includes a second insulation material having a second thermal conductivity greater than the first thermal conductivity and contacting the first insulation material.

5 Claims, 13 Drawing Sheets

INTEGRATED CIRCUIT HAVING AN INSULATED MEMORY

CROSS-REFERENCE TO RELATED APPLICATIONS

This application is related U.S. patent application Ser. No. 11/133,491, entitled "LOW POWER PHASE CHANGE MEMORY CELL WITH LARGE READ SIGNAL," filed May 20, 2005, and U.S. patent application Ser. No. 11/204,201, entitled "MEMORY DEVICE THAT PROGRAMS MORE THAN TWO STATES INTO MEMORY CELL," filed Aug. 15, 2005, which are incorporated herein by reference.

BACKGROUND

Phase-change memories are based on phase-change materials that exhibit at least two different states. Phase-change material may be used in memory cells to store bits of data. The states of phase-change material may be referred to as amorphous and crystalline states. The states may be distinguished because the amorphous state generally exhibits higher resistivity than does the crystalline state. Generally, the amorphous state involves a more disordered atomic structure, while the crystalline state involves a more ordered lattice. Some phase-change materials exhibit more than one crystalline state, e.g. a face-centered cubic (FCC) state and a hexagonal closest packing (HCP) state. These two crystalline states have different resistivities and may be used to store bits of data. In the following description, the amorphous state generally refers to the state having the higher resistivity, and the crystalline state generally refers to the state having the lower resistivity.

Phase change in the phase-change materials may be induced reversibly. In this way, the memory may change from the amorphous state to the crystalline state and from the crystalline state to the amorphous state, in response to temperature changes. The temperature changes to the phase-change material may be achieved in a variety of ways. For example, a laser can be directed to the phase-change material, current may be driven through the phase-change material, or current can be fed through a resistive heater adjacent the phase-change material. In any of these methods, controllable heating of the phase-change material causes controllable phase change within the phase-change material.

A phase-change memory including a memory array having a plurality of memory cells that are made of phase-change material may be programmed to store data utilizing the memory states of the phase-change material. One way to read and write data in such a phase-change memory device is to control a current and/or a voltage pulse that is applied to the phase-change material. The level of current and/or voltage generally corresponds to the temperature induced within the phase-change material in each memory cell.

To achieve higher density phase-change memories, a phase-change memory cell can store multiple bits of data. Multi-bit storage in a phase-change memory cell can be achieved by programming the phase-change material to have intermediate resistance values or states. If the phase-change memory cell is programmed to three different resistance levels, 1.5 bits of data per cell can be stored. If the phase-change memory cell is programmed to four different resistance levels, 2 bits of data per cell can be stored, and so on. For simplicity, the description in this disclosure is substantially focused on four different resistance levels or states and 2 bits of data per cell. This is, however, for illustrative purposes only and not intended to limit the scope of the invention. In principle it is possible to store 3 or more states. To program a phase-change memory cell to an intermediate resistance value, the amount of crystalline material coexisting with amorphous material and hence the cell resistance is controlled using a suitable write strategy.

SUMMARY

One embodiment of the present invention provides a memory cell. The memory cell includes a first electrode, a second electrode, and phase-change material between the first electrode and the second electrode. The phase-change material defines a narrow region. The memory cell includes first insulation material having a first thermal conductivity and contacting the phase-change material. A maximum thickness of the first insulation material contacts the narrow region. The memory cell includes a second insulation material having a second thermal conductivity greater than the first thermal conductivity and contacting the first insulation material.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
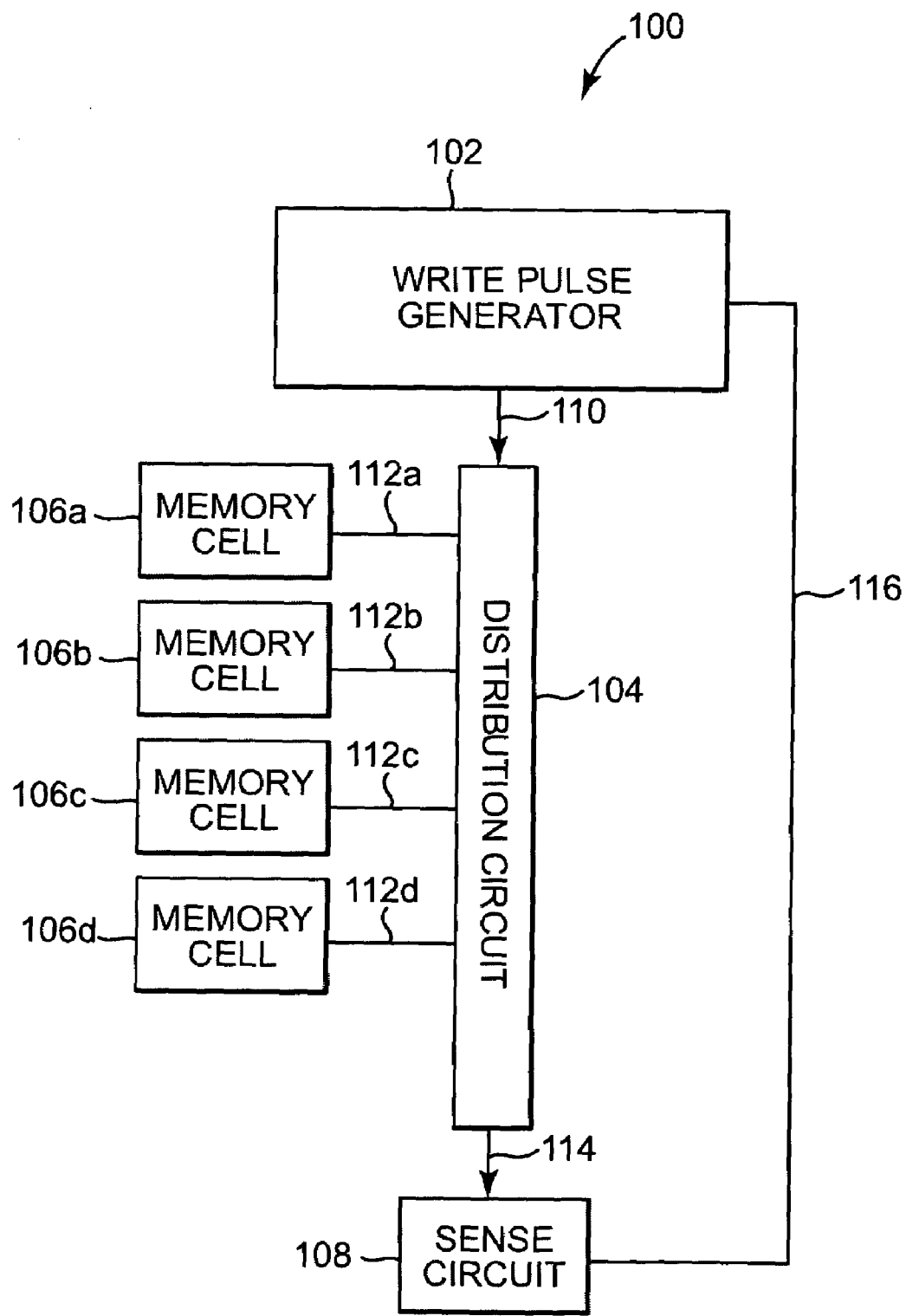
FIG. 1 is a block diagram illustrating one embodiment of a memory device.

FIG. 1 is a block diagram illustrating one embodiment of a memory device 100. Memory device 100 includes a write pulse generator 102, a distribution circuit 104, memory cells 106a, 106b, 106c, and 106d, and a sense circuit 108. Each of the memory cells 106a-106d is a phase-change memory cell that stores data based on the amorphous and crystalline states of phase-change material in the memory cell. Also, each of the memory cells 106a-106d can be programmed into one of more than two states by programming the phase-change material to have intermediate resistance values. To program one of the memory cells 106a-106d to an intermediate resistance value, the amount of crystalline material coexisting with amorphous material—and hence the cell resistance—is controlled using a suitable write strategy.

In one embodiment, write pulse generator 102 provides pulses to memory cells 106a-106d and programs one of more than two resistance levels or states into the phase-change material of each of the memory cells 106a-106d. Sense circuit 108 senses the state of the phase-change material and provides signals that indicate the state of the phase-change material in a memory cell. Write pulse generator 102 receives the signals and programs the desired state into the phase-change material based on the signal feedback.

Write pulse generator 102 is electrically coupled to distribution circuit 104 though write pulse path 110. Distribution circuit 104 is electrically coupled to each of the memory cells 106a-106d through cell paths 112a-112d. Distribution circuit 104 is electrically coupled to memory cell 106a through cell path 112a. Distribution circuit 104 is electrically coupled to memory cell 106b through cell path 112b. Distribution circuit 104 is electrically coupled to memory cell 106c through cell path 112c. Distribution circuit 104 is electrically coupled to memory cell 106d through cell path 112d. In addition, distribution circuit 104 is electrically coupled to sense circuit 108 through sense path 114, and sense circuit 104 is electrically coupled to write pulse generator 102 through signal path 16.

Each of the memory cells 106a-106d include a phase-change material that may be changed from an amorphous state to a crystalline state or from a crystalline state to an amorphous state under the influence of temperature change. The amount of crystalline phase-change material coexisting with amorphous phase-change material in one of the memory cells 106a-106d thereby defines more than two states for storing data within memory device 100. In the amorphous state, a phase-change material exhibits significantly higher resistivity than in the crystalline state. Therefore, the more than two states of memory cells 106a-106d differ in their electrical resistivity. In one embodiment, the more than two states include three states and a trinary system is used, wherein the three states are assigned bit values of "0", "1", and "2". In one embodiment, the more than two states are four states that are assigned multi-bit values, such as "00", "01", "10", and "11". In other embodiments, the more than two states can be any suitable number of states in the phase-change material of a memory cell.

In one embodiment, write pulse generator 102 provides voltage pulses to distribution circuit 104 through write pulse path 110 and distribution circuit 104 controllably directs the voltage pulses to memory cells 106a-106d through cell paths 112a-112d. In one embodiment, distribution circuit 104 includes a plurality of transistors that controllably direct voltage pulses to each of the memory cells 106a-106d. In other embodiments, write pulse generator 102 provides current pulses to distribution circuit 104 through write pulse path 110 and distribution circuit 104 controllably directs the current pulses to memory cells 106a-106d through cell paths 112a-112d.

Sense circuit 108 reads each of the more than two states of memory cells 106a-106d through sense path 114. Distribution circuit 104 controllably directs read signals between sense circuit 108 and memory cells 106a-106d through cell paths 112a-112d. In one embodiment, distribution circuit 104 includes a plurality of transistors that controllably direct read signals between sense circuit 108 and memory cells 106a-106d. In one embodiment, to read the resistance of one of the memory cells 106a-106d, sense circuit 108 provides current that flows through one of the memory cells 106a-106d and sense circuit 108 reads the voltage across that one of the memory cells 106a-106d. In one embodiment, sense circuit 108 provides voltage across one of the memory cells 106a-106d and reads the current that flows through that one of the memory cells 106a-106d. In one embodiment, write pulse generator 102 provides voltage across one of the memory cells 106a-106d and sense circuit 108 reads the current that flows through that one of the memory cells 106a-106d. In one embodiment, write pulse generator 102 provides current through one of the memory cells 106a-106d and sense circuit 108 reads the voltage across that one of the memory cells 106a-106d.

In operation of one embodiment, write pulse generator 102 resets the phase-change material in memory cells 106a-106d. A reset operation includes heating the phase-change material of the target memory cell above its melting temperature and quickly cooling the phase-change material to thereby achieve a substantially amorphous state. This amorphous state is one of the more than two states of each of the memory cells 106a-106d and is the highest resistance state.

In one embodiment, write pulse generator 102 is configured to provide multiple sequential pulses to program a selected one of the more than two states into a selected one of the memory cells 106a-106d. Write pulse generator 102 provides a pulse to the selected one of the memory cells 106a-106d to crystallize part of the phase-change material and thereby lower the resistance of the selected one of the memory cells 106a-106d. Sense circuit 108 reads the resistance of the selected one of the memory cells 106a-106d and provides signals that indicate the sensed resistance value to write pulse generator 102. If the resistance value is higher than the selected one of the more than two states, write pulse generator 102 provides another pulse to the selected one of the memory cells 106a-106d to crystallize more of the phase-change material and thereby further lower the resistance of the selected one of the memory cells 106a-106d. Sense circuit 108 reads the resistance of the selected one of the memory cells 106a-106d and provides the sensed resistance value to write pulse generator 102. This continues until the resistance value is lower than an upper limit of the resistance value of the selected one of the more than two states.

Next, if the resistance value is higher than a lower limit of the resistance value of the selected one of the more than two states, write pulse generator 102 is done programming the selected one of the memory cells 106a-106d. If the resistance value is lower than the lower limit of the resistance value of the selected one of the more than two states, the programming sequence is repeated from the beginning, wherein write pulse generator 102 resets the phase-change material in the selected one of the memory cells 106a-106d and provides a pulse to begin programming the selected one of the memory cells 106a-106d.

In operation of another embodiment, write pulse generator 102 sets the phase-change material in memory cells 106a-106d. A set operation includes heating the phase-change material of the target memory cell above its crystallization temperature, but below its melting temperature, long enough to achieve a crystalline state. This crystalline state is one of the more than two states of each of the memory cells 106a-106d and is the lowest resistance state.

In one embodiment, write pulse generator 102 is configured to provide a pulse with a calculated amplitude, duration, and/or shape to program a selected one of the more than two states into a selected one of the memory cells 106a-106d. Write pulse generator 102 provides a pulse to the selected one of the memory cells 106a-106d to melt and quickly cool part of the phase-change material and thereby achieve an amorphous state in that part of the phase-change material, which raises the resistance of the selected one of the memory cells 106a-106d. Sense circuit 108 reads the resistance of the selected one of the memory cells 106a-106d and provides signals that indicate the sensed resistance value to write pulse generator 102. If the resistance value is between an upper limit and a lower limit of the selected one of the more than two states, write pulse generator 102 is done programming the selected one of the memory cells 106a-106d. If the resistance value is higher than the upper limit or lower than the lower limit of the selected one of the more than two states, the pulsing sequence is repeated. In one embodiment, to repeat the pulsing sequence, write pulse generator 102 sets the phase-change material in the selected one of the memory cells 106a-106d and provides another calculated pulse to program the selected one of the memory cells 106a-106d. To adjust for the overshoot or undershoot of the targeted resistance value, the pulse parameters are recalculated and adjusted. For example, if the cell resistance value is too low, the pulse amplitude may be increased, and if the cell resistance value is too high, the pulse amplitude may be decreased.

In operation of another embodiment, write pulse generator 102 resets the phase-change material in memory cells 106a-106d, which includes heating the phase-change material of the target memory cell above its melting temperature and quickly cooling the phase-change material to thereby achieve a substantially amorphous state. This amorphous state is one of the more than two states of each of the memory cells 106a-106d and is the highest resistance state.

In one embodiment, write pulse generator 102 provides a pulse to program a selected one of the more than two states into a selected one of the memory cells 106a-106d. Write pulse generator 102 provides the pulse to the selected one of the memory cells 106a-106d to crystallize part of the phase-change material and thereby lower the resistance of the selected one of the memory cells 106a-106d.

In one embodiment, the pulse is a voltage pulse and sense circuit 108 senses current flowing through the phase-change material of the selected one of the memory cells 106a-106d during the duration of the voltage pulse. The level of the current corresponds to the temperature induced within the phase-change material and the amount of phase-change material crystallized. In another embodiment, the pulse is a current pulse and sense circuit 108 senses voltage across the selected one of the memory cells 106a-106d during the current pulse. The level of the voltage corresponds to the temperature induced within the phase-change material and the amount of phase-change material crystallized.

Sense circuit 108 senses the resistance value of a memory cell during the pulse, referred to as the present resistance value or present state of the memory cell, and provides signals that indicate reaching the selected one of the more than two states. Write pulse generator 102 receives the signals and adjusts the pulse length of the pulse, such as by terminating the pulse, based on the signals.

In operation of another embodiment, write pulse generator 102 sets the phase-change material in memory cells 106a-106d, which includes heating the phase-change material of the target memory cell above its crystallization temperature, but below its melting temperature, long enough to achieve a crystalline state. This crystalline state is one of the more than two states of each of the memory cells 106a-106d and is the lowest resistance state.

Write pulse generator 102 is configured to provide a pulse to program a selected one of the more than two states into a selected one of the memory cells 106a-106d. Write pulse generator 102 provides the pulse to the selected one of the memory cells 106a-106d to melt and quickly cool part of the phase-change material and thereby achieve an amorphous state in that part of the phase-change material, which raises the resistance of the selected one of the memory cells 106a-106d.

In one embodiment, the pulse is a voltage pulse and sense circuit 108 senses current flowing through the phase-change material of the selected one of the memory cells 106a-106d during the voltage pulse. The level of current corresponds to the temperature induced within the phase-change material and the amount of phase-change material that has achieved an amorphous state. In another embodiment, the pulse is a current pulse and sense circuit 108 senses voltage across the selected one of the memory cells 106a-106d during the current pulse. The level of the voltage corresponds to the temperature induced within the phase-change material and the amount of phase-change material that has achieved an amorphous state.

Sense circuit 108 senses the present resistance value or present state of the memory cell during the pulse and provides signals that indicate reaching the selected one of the more than two states. Write pulse generator 102 receives the signals and adjusts the pulse length of the pulse, such as by terminating the pulse, based on the signals.

Figure 2:
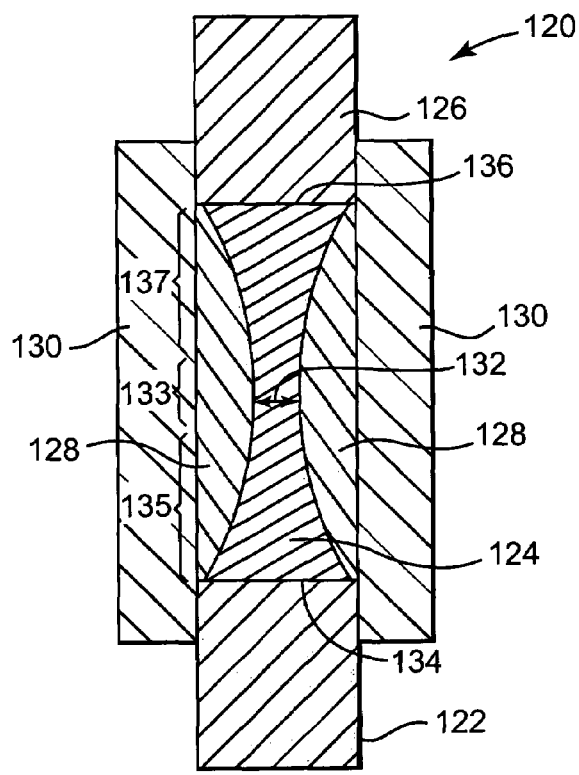
FIG. 2 illustrates a cross-sectional view of one embodiment of a phase-change memory cell.

FIG. 2 illustrates a cross-sectional view of one embodiment of a phase-change memory cell 120. In one embodiment, phase-change memory cell 120 is a pillar phase-change memory cell. Phase-change memory cell 120 includes a first electrode 122, phase-change material 124, second electrode 126, first insulation material 128, and second insulation material 130. First insulation material 128 has a lower thermal conductivity than second insulation material 130. Phase-change material 124 provides a storage location for storing one bit, two bits, or several bits of data. Phase-change material 124 is laterally completely enclosed by first insulation material 128, which defines the current path and hence the location of the phase-change region in phase-change material 124. In another embodiment, phase-change material 124 is partially enclosed by first insulation material 128 and partially enclosed by second insulation material 130. In one embodiment, each of the memory cells 106a-106d is similar to phase-change memory cell 120.

Phase-change material 124 includes a first portion 135 in contact with first electrode 122 at 134, a second portion 137 in contact with second electrode 126 at 136, and a third portion 133 between first portion 135 and second portion 137. First portion 135 of phase-change material 124 has a maximum width or cross-section at 134, second portion 127 of phase-change material 124 has a maximum width or cross-section at 136, and third portion 133 of phase-change material 124 has a minimum width or cross-section at 132. The maximum width at 134 of first portion 135 and the maximum width at 136 of second portion 137 are greater than the minimum width at 132 of third portion 133.

In one embodiment, a maximum width of third portion 133 is less than a minimum width of first portion 135 and a minimum width of second portion 137. In another embodiment, a minimum width of third portion 133 is less than a minimum width of first portion 135 and a minimum width of second portion 137. In another embodiment, a maximum width of third portion 133 is less than a maximum width of first portion 135 and a maximum width of second portion 137. In another embodiment, a minimum width of third portion 133 is less than a maximum width of first portion 135 and a maximum width of second portion 137. In one embodiment, the maximum width at 134 of first portion 135 is approximately equal to the maximum width at 136 of second portion 137. In other embodiments, the maximum width at 134 of first portion 135 is different than the maximum width at 136 of second portion 137. In one embodiment, phase-change material 124 forms an hourglass shape. In one embodiment, third portion 133 is completely laterally enclosed by first insulation material 128, and first portion 135 and second portion 137 are completely laterally enclosed by second insulation material 130.

Phase-change material 124 may be made up of a variety of materials in accordance with the present invention. Generally, chalcogenide alloys that contain one or more elements from group VI of the periodic table are useful as such materials. In one embodiment, phase-change material 124 of memory cell 120 is made up of a chalcogenide compound material, such as GeSbTe, SbTe, or AgInSbTe. In another embodiment, the phase-change material can be chalcogen free such as GeSb, GaSb, or GeGaSb.

First insulation material 128 includes an insulation material with low thermal conductivity, such as SiO$_2$, a low-k material, or another suitable insulation material having a low thermal conductivity. Second insulation material 130 includes an insulation material with a higher thermal conductivity than insulation material 128, such as SiN or another suitable insulation material having a higher thermal conductivity than insulation material 128. Electrodes 122 and 126 comprise TiN, TaN, W, or another suitable electrode material.

Figure 3:
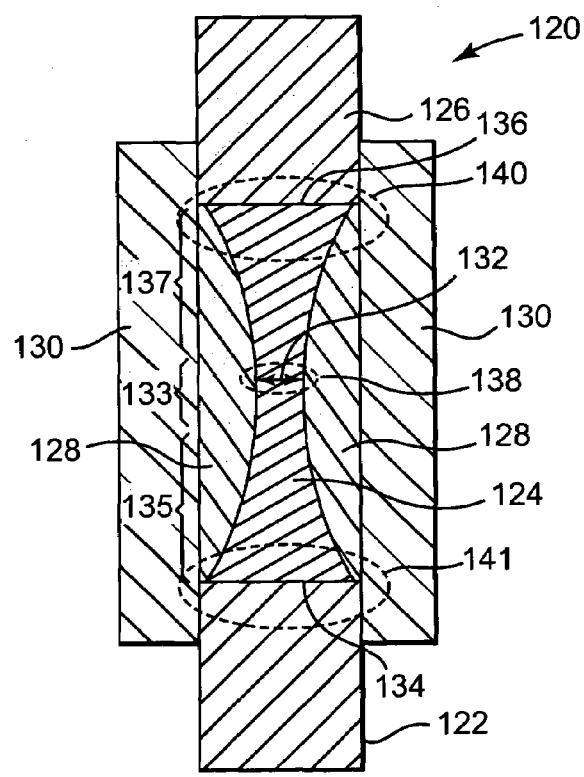
FIG. 3 illustrates a cross-sectional view of one embodiment of a phase-change memory cell including the identification of a temperature distribution during a write operation.

FIG. 3 illustrates a cross-sectional view of one embodiment of phase change memory cell 120 including the identification of a temperature distribution during a write operation. During operation, a write pulse is applied between first electrode 122 and second electrode 126 to program phase-change memory cell 120. Since first insulation material 128 has a lower thermal conductivity than second insulation material 130 and third portion 133 of phase-change material 124 is narrower than first portion 135 and second portion 137, the highest temperature within phase-change material 124 during a write pulse is at center portion 138. The temperature decreases from center portion 138 to upper portion 140 and from center portion 138 to lower portion 141. The hourglass shape of phase-change material 124 in combination with the low heat capacitance/conductance of first insulation material layer 128 and the high heat capacitance/conductance of second insulation material layer 130 creates a controlled heat gradient along phase-change memory cell 120 during the application of write pulses to phase-change memory cell 120.

Due to the improved thermal isolation around center portion 138 of phase-change material 124, and a comparatively poor thermal isolation at upper portion 140 and lower portion 141, a strong temperature gradient along the vertical cell axis is created during both set and reset operations. This effect is enhanced because the highest current density for phase-change material 124 is also at center portion 138. This temperature gradient improves the control over the amount of crystallized or melted material, since to increase the amount of material affected by the phase change, significantly different (higher) pulse heights are used. A precise control over the amount of crystallized or melted material improves the distribution function for storing one bit, two bits, or several bits of data in phase-change memory cell 120.

Figure 4:
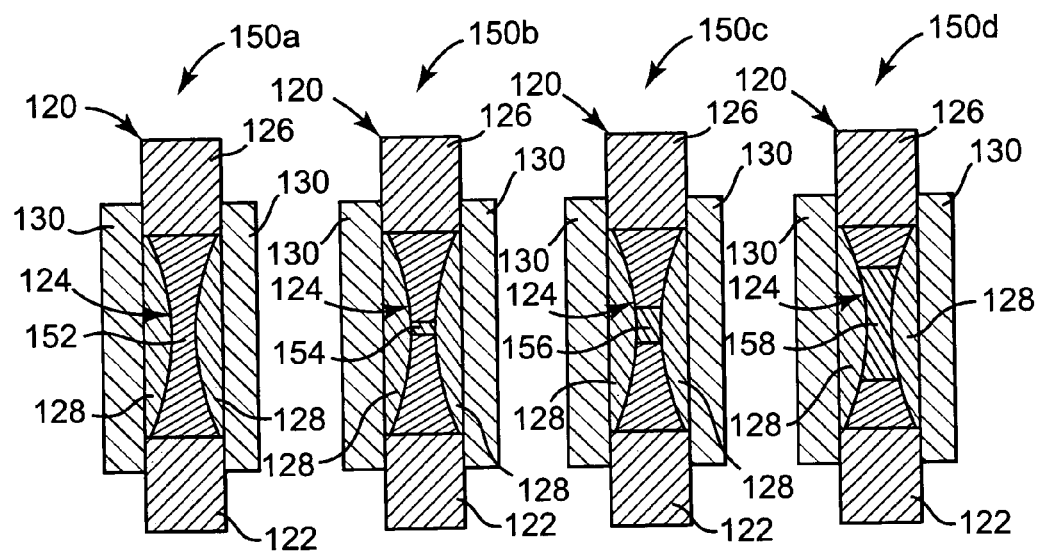
FIG. 4 illustrates a cross-sectional view of one embodiment of a phase-change memory cell in four different states.

FIG. 4 illustrates a cross-sectional view of one embodiment of memory cell 120 in four different states at 150$a$, 150$b$, 150$c$, and 150$d$. Pulses are provided to memory cell 120 through first and second electrodes 122 and 126. The current path through phase-change material 124 is from one of the first and second electrodes 122 and 126 to the other one of the first and second electrodes 122 and 126.

Phase-change material 124 is programmed into one of four states to store two bits of data. A selection device, such as an active device like a transistor or diode, is coupled to first electrode 122 to control the application of pulses to phase-change material 124. The pulses set phase-change material 124 and program the other three states into phase-change material 124. At 150$b$, a small middle region 154 of phase-change material 124 in memory cell 120 has been programmed to change the resistance through phase-change material 124 and memory cell 120. At 150$c$, a medium sized middle region 156 of phase-change material 124 in memory cell 120 has been programmed to change the resistance through phase-change material 124 and memory cell 120. At 150$d$, a large middle region 158 of phase-change material 124 in memory cell 120 has been programmed to change the resistance through phase-change material 124 and memory cell 120. The size of the middle region is related to the resistance through phase-change material 124 and memory cell 120. The three different sized middle region states at 150$b$-150$d$ plus the initial state at 150$a$ provide four states in phase-change material 124, and memory cell 120 provides a storage location for storing two bits of data. In one embodiment, the state of memory cell 120 at 150$a$ is a "00", the state of memory cell 120 at 150$b$ is a "01", the state of memory cell 120 at 150$c$ is a "10", and the state of memory cell 120 at 150$d$ is a "11".

At 150$a$, phase-change material 124 is set to a crystalline state 152. During a set operation of memory cell 120, a set pulse is selectively enabled to first electrode 122 thereby heating phase-change material 124 above its crystallization temperature, but below its melting temperature. In this way, essentially all of phase-change material 124 reaches a crystalline state 152 during the set operation. Memory cell 120 is in the crystalline state at 150$a$, which is the lowest resistance state.

To program phase-change material 124 into one of the other three states 150$b$-150$d$, one or more pulses are provided by a write pulse generator, such as write pulse generator 102. At 150$b$, one or more pulses are provided to program the small middle region at 154 into an amorphous state. The amorphous state is more resistive than the crystalline state, and memory cell 120 at 150$b$ has a higher resistance than memory cell 120 in the crystalline state at 150$a$. At 150$c$, one or more pulses are provided to program the medium sized middle region at 156 into an amorphous state. Since the medium sized middle region at 156 is larger than the small middle region at 154 and the amorphous state is more resistive than the crystalline state, memory cell 120 at 150$c$ has a higher resistance than memory cell 120 at 150$b$ and memory cell 120 in the crystalline state at 150a. At 150d, one or more pulses are provided to program the large middle region at 158 into the amorphous state. Since the large middle region at 158 is larger than the medium sized middle region at 156 and the amorphous state is more resistive than the crystalline state, memory cell 120 at 150d has a higher resistance than memory cell 120 at 150c, memory cell 120 at 150b, and memory cell 120 in the crystalline state at 150a. Memory cell 120 at 150d is at the highest resistance state. In other embodiments, memory cell 120 can be programmed into any suitable number of resistance values or states.

Figure 5:
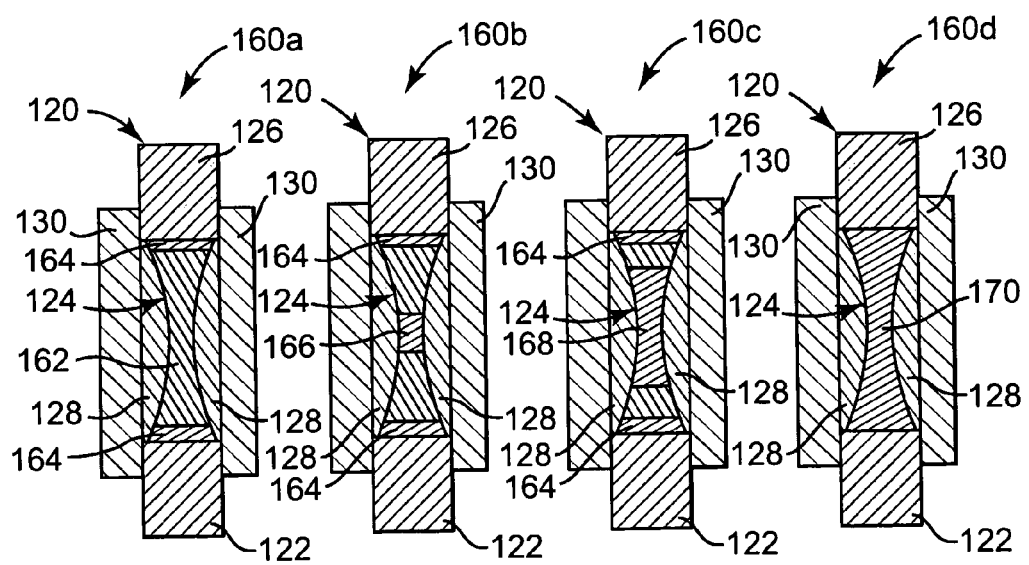
FIG. 5 illustrates a cross-sectional view of another embodiment of a phase-change memory cell in four different states.

FIG. 5 illustrates a cross-sectional view of another embodiment of memory cell 120 in four different states at 160a, 160b, 160c, and 160d. Phase-change material 124 is programmed into one of four states to store two bits of data. A selection device, such as an active device like a transistor or diode, is coupled to first electrode 122 to control the application of pulses to phase-change material 124. The pulses reset phase-change material 124 and program the other three states into phase-change material 124.

At 160b, a small middle region 166 of phase-change material 124 has been programmed to change the resistance through phase-change material 124 and memory cell 120. At 160c, a medium sized middle region 168 of phase-change material 124 has been programmed to change the resistance through phase-change material 124 and memory cell 120. At 160d, a large middle region 170, which is substantially all of phase-change material 124, has been programmed to change the resistance through phase-change material 124 and memory cell 120. The size of the programmed middle region is related to the resistance through phase-change material 124 and memory cell 120. The three different sized middle region states at 160b-160d plus the initial state at 160a provide four states in phase-change material 124, and memory cell 120 provides a storage location for storing two bits of data. In one embodiment, the state of memory cell 120 at 160a is a "00", the state of memory cell 120 at 160b is a "01", the state of memory cell 120 at 160c is a "10", and the state of memory cell 120 at 160d is a "11".

At 160a, phase-change material 124 is reset to a substantially amorphous state 162. During a reset operation of memory cell 120, a reset pulse is selectively enabled by the selection device and sent through first electrode 122 and phase-change material 124. The reset pulse heats phase-change material 124 above its melting temperature and phase-change material 124 is quickly cooled to achieve the substantially amorphous state at 160a. After a reset operation, phase-change material 124 includes crystalline state phase-change material at 164, and amorphous state phase-change material at 162. The substantially amorphous state at 160a is the highest resistance state of memory cell 120.

To program phase-change material 124 into one of the other three states 160b-160d, one or more pulses are provided by a write pulse generator, such as write pulse generator 102. At 160b, one or more pulses are provided to program the small middle region at 166 into a crystalline state. The crystalline state is less resistive than the amorphous state, and memory cell 120 at 160b has a lower resistance than memory cell 120 in the substantially amorphous state at 160a. At 160c, one or more pulses are provided to program the medium sized middle region at 168 into a crystalline state. Since the medium sized middle region at 168 is larger than the small middle region at 166 and the crystalline state is less resistive than the amorphous state, memory cell 120 at 160c has a lower resistance than memory cell 120 at 160b and memory cell 120 in the amorphous state at 160a. At 160d, one or more pulses are provided to program the large middle region at 170 into the crystalline state. Since the large middle region at 170 is larger than the medium sized middle region at 168 and the crystalline state is less resistive than the amorphous state, memory cell 120 at 160d has a lower resistance than memory cell 120 at 160c, memory cell 120 at 160b, and memory cell 120 in the amorphous state at 160a. Memory cell 120 at 160d is in the lowest resistance state. In other embodiments, memory cell 120 can be programmed into any suitable number of resistance values or states.

Figure 6A:
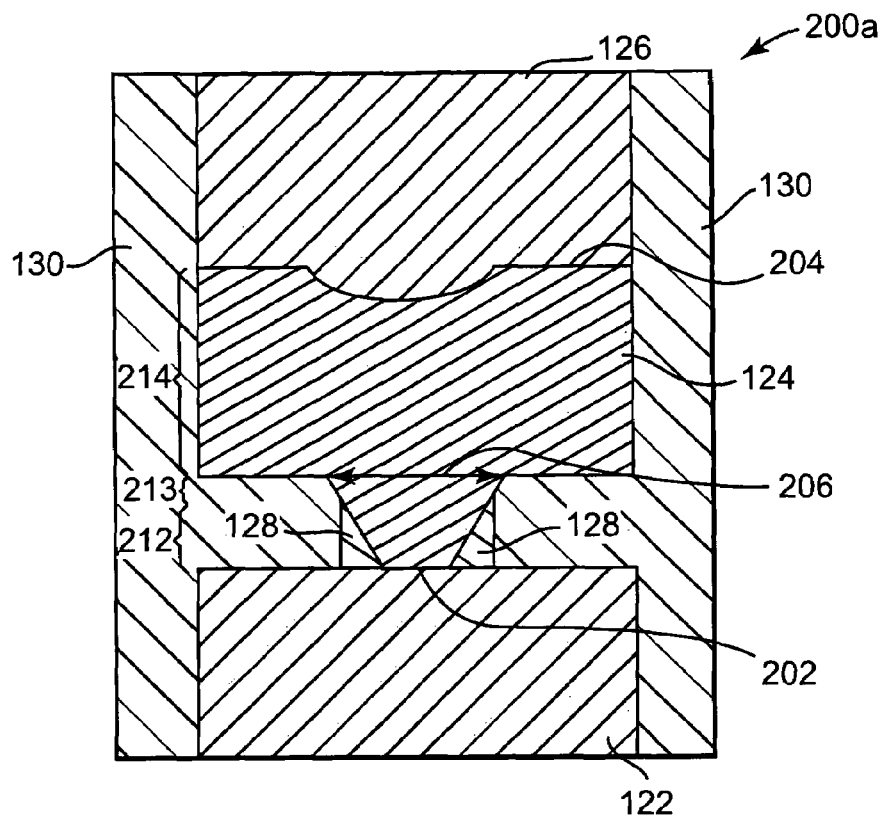
FIG. 6A illustrates a cross-sectional view of another embodiment of a phase-change memory cell.

FIG. 6A illustrates a cross-sectional view of another embodiment of a phase-change memory cell 200a. In one embodiment, phase-change memory cell 200a is a tapered via phase-change memory cell. Phase-change memory cell 200a includes first electrode 122, phase-change material 124, second electrode 126, first insulation material 128, and second insulation material 130. First insulation material 128 has a lower thermal conductivity than second insulation material 130. Phase-change material 124 provides a storage location for storing one bit, two bits, or several bits of data. In one embodiment, each of the memory cells 106a-106d is similar to phase-change memory cell 200a.

Phase-change material 124 includes a first portion 212 in contact with first electrode 122 at 202, a second portion 214 in contact with second electrode 126 at 204, and a third portion 213 between first portion 212 and second portion 214. First portion 212 and third portion 213 of phase-change material 124 is tapered or V shaped and has a maximum width or cross-section at 206 and a minimum width or cross-section at 202. The maximum width at 206 of third portion 213 is less than the width or cross-section of second portion 214. First portion 212 of phase-change material 124 is laterally completely enclosed by first insulation material 128, and third portion 214 of phase-change material 124 is laterally completely enclosed by second insulation material 130. First portion 212 and third portion 213 define the current path and hence the location of the phase-change region in phase-change material 124.

Figure 6B:
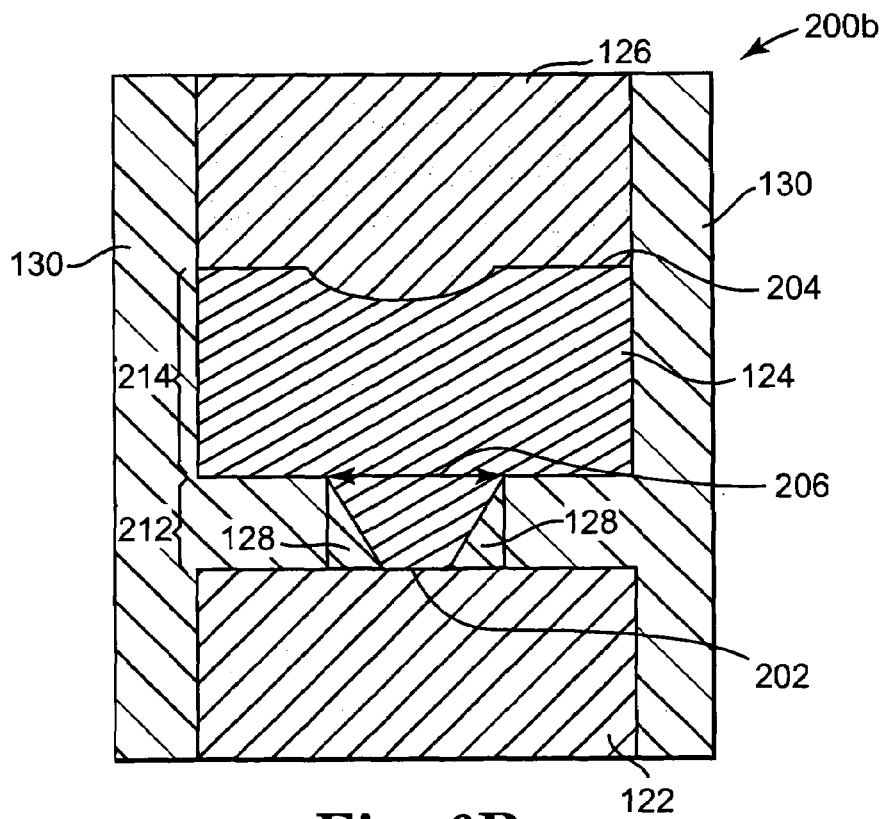
FIG. 6B illustrates a cross-sectional view of another embodiment of a phase-change memory cell.

FIG. 6B illustrates a cross-sectional view of another embodiment of a phase-change memory cell 200b. Phase-change memory cell 200b is similar to phase-change memory cell 200a except that first portion 212 of phase-change material 124 includes third portion 213 and is laterally completely enclosed by first insulation material 128, which defines the current path and hence the location of the phase-change region in phase-change material 124.

Figure 7:
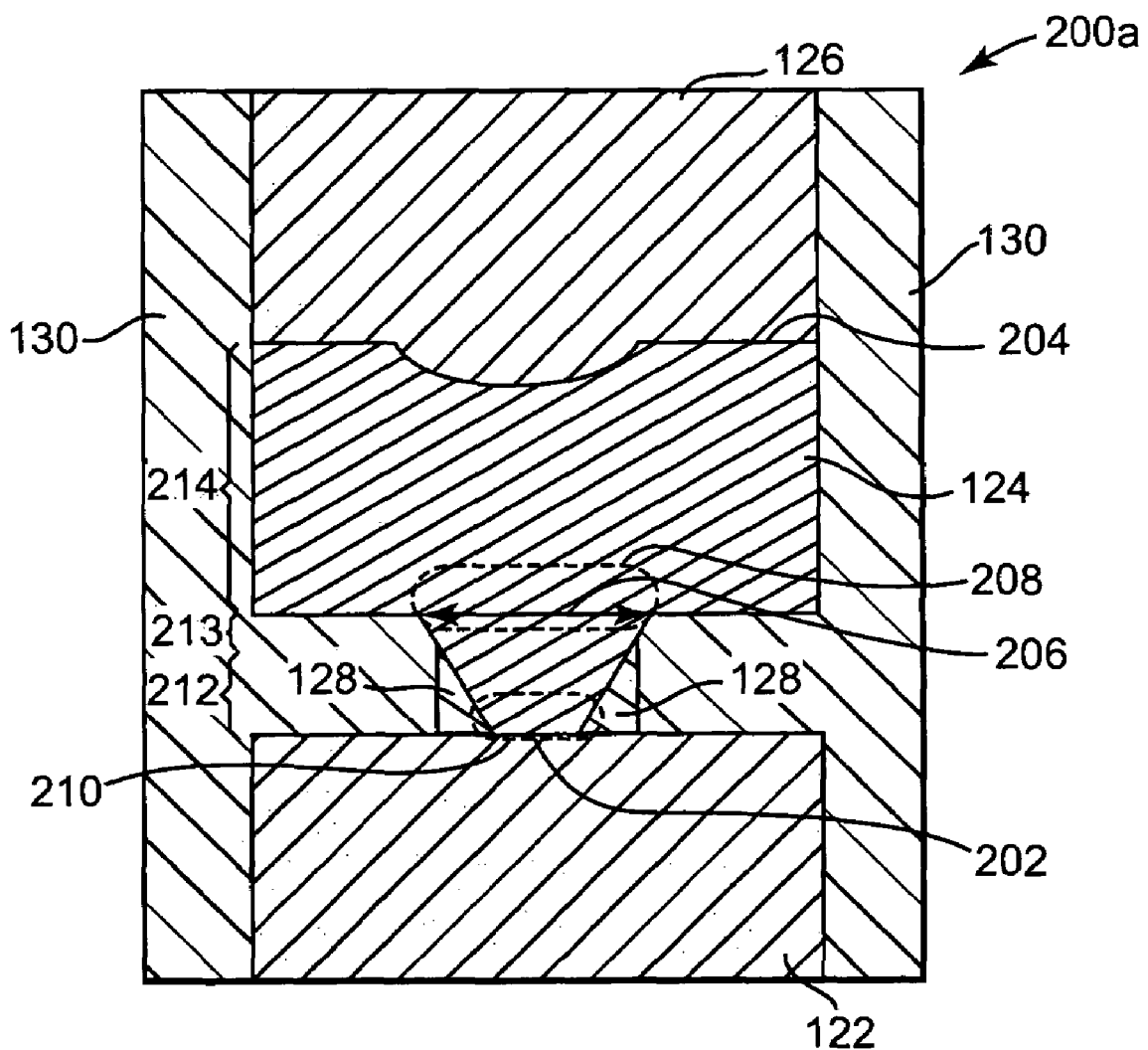
FIG. 7 illustrates a cross-sectional view of another embodiment of a phase-change memory cell including the identification of a temperature distribution during a write operation.

FIG. 7 illustrates a cross-sectional view of one embodiment of phase-change memory cell 200a including the identification of a temperature distribution during a write operation. During operation, a write pulse is applied between first electrode 122 and second electrode 126 to program phase-change memory cell 200a. Since first insulation material 128 has a lower thermal conductivity than second insulation material 130 and first portion 212 of the tapered or V shaped portion of phase-change material 124 is narrower than third portion 213 of the tapered or V shaped portion of phase-change material 124, the highest temperature within phase-change material 124 during a write pulse is at bottom portion 210. The temperature decreases from bottom portion 210 to upper portion 208. The tapered or V shape of first portion 212 of phase-change material 124 in combination with the low heat capacitance/conductance of first insulation material layer 128 and the high heat capacitance/conductance of second insulation material layer 130 creates a controlled heat gradient along phase-change memory cell 200a during the application of write pulses to phase-change memory cell 200a.

Due to the improved thermal isolation around bottom portion 210 of phase-change material 124, and a comparatively poor thermal isolation at 206 and at upper portion 208, a strong temperature gradient along the vertical cell axis is created during both set and reset operations. This effect is enhanced because the highest current density for phase-change material 124 is also at bottom portion 210. This temperature gradient improves the control over the amount of crystallized or melted material, since to increase the amount of material affected by the phase change, significantly different (higher) pulse heights are used. In another embodiment, during crystallization, pulses with significantly different length can be used to increase the amount of crystallized material. A precise control over the amount of crystallized or melted material improves the distribution function for storing one bit, two bits, or several bits of data in phase-change memory cell 200a and 200b.

Figure 8:
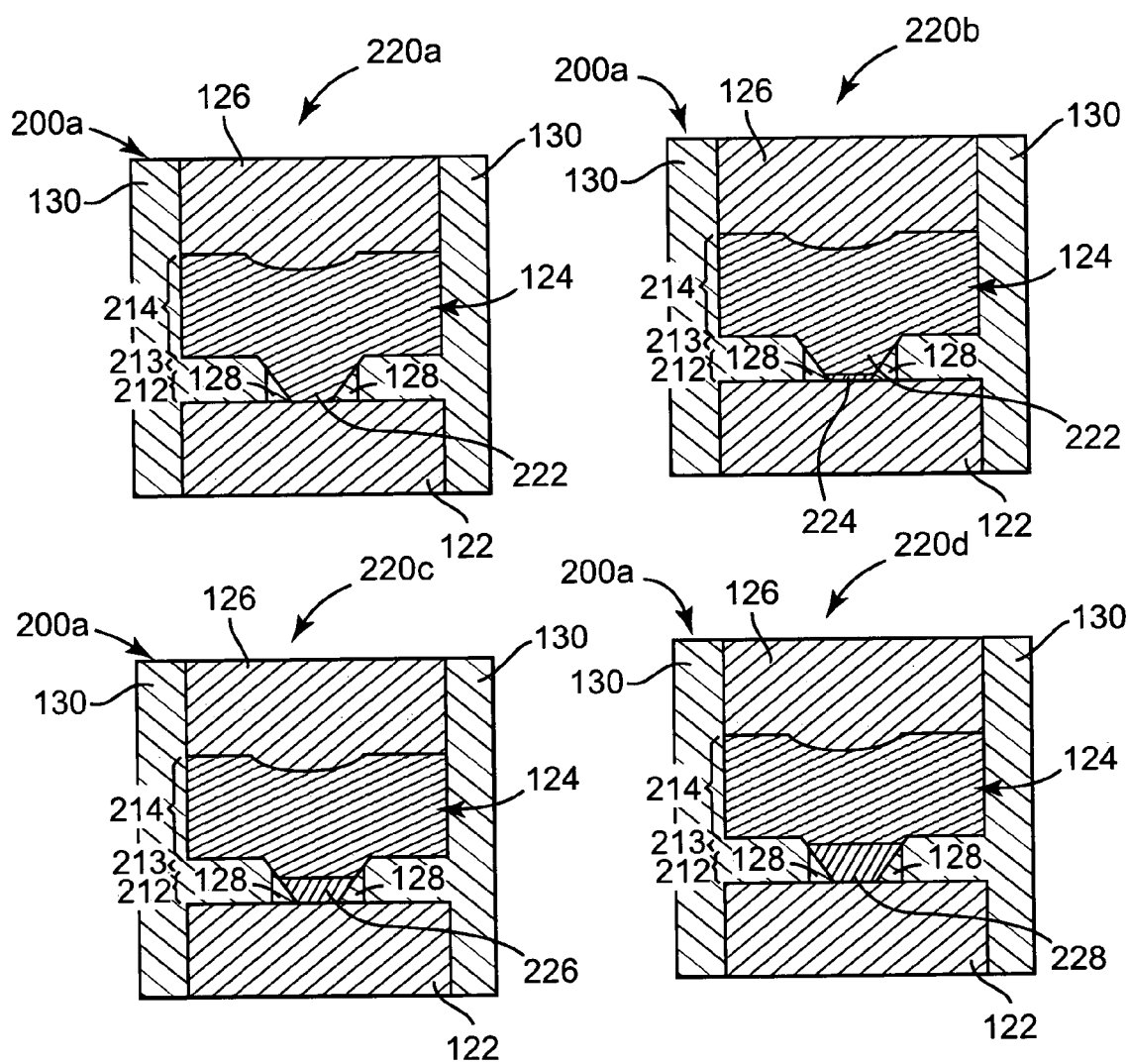
FIG. 8 illustrates a cross-sectional view of another embodiment of a phase-change memory cell in four different states.

FIG. 8 illustrates a cross-sectional view of one embodiment of memory cell 200a in four different states at 220a, 220b, 220c, and 220d. Phase-change material 124 is programmed into one of four states to store two bits of data. A selection device, such as an active device like a transistor or diode, is coupled to first electrode 122 to control the application of pulses to phase-change material 124. The pulses set phase-change material 124 and program the other three states into phase-change material 124.

At 220b, a small bottom region 224 of phase-change material 124 in memory cell 200a has been programmed to change the resistance through phase-change material 124 and memory cell 200a. At 220c, a medium sized bottom region 226 of phase-change material 124 in memory cell 200a has been programmed to change the resistance through phase-change material 124 and memory cell 200a. At 220d, a large bottom region 228 of phase-change material 124 in memory cell 200a has been programmed to change the resistance through phase-change material 124 and memory cell 200a. The size of the bottom region is related to the resistance through phase-change material 124 and memory cell 200a. The three different sized bottom region states at 220b-220d plus the initial state at 220a provide four states in phase-change material 124, and memory cell 200a provides a storage location for storing two bits of data. In one embodiment, the state of memory cell 200a at 220a is a "00", the state of memory cell 200a at 220b is a "01", the state of memory cell 200a at 220c is a "10", and the state of memory cell 200a at 220d is a "11".

At 220a, phase-change material 124 is set to a crystalline state 222. During a set operation of memory cell 200a, a set pulse is selectively enabled to first electrode 122 thereby heating phase-change material 124 above its crystallization temperature, but below its melting temperature. In this way, essentially all of phase-change material 124 of first portion 212 reaches a crystalline state 222 during the set operation. Memory cell 200a is in the crystalline state at 220a, which is the lowest resistance state.

To program phase-change material 124 into one of the other three states 220b-220d, one or more pulses are provided by a write pulse generator, such as write pulse generator 102. At 220b, one or more pulses are provided to program the small bottom region at 224 into an amorphous state. The amorphous state is more resistive than the crystalline state, and memory cell 200a at 220b has a higher resistance than memory cell 200a in the crystalline state at 220a. At 220c, one or more pulses are provided to program the medium sized bottom region at 226 into an amorphous state. Since the medium sized bottom region at 226 is larger than the small bottom region at 224 and the amorphous state is more resistive than the crystalline state, memory cell 200a at 220c has a higher resistance than memory cell 200a at 220b and memory cell 200a in the crystalline state at 220a. At 220d, one or more pulses are provided to program the large bottom region at 228 into the amorphous state. Since the large bottom region at 228 is larger than the medium sized bottom region at 226 and the amorphous state is more resistive than the crystalline state, memory cell 200a at 220d has a higher resistance than memory cell 200a at 220c, memory cell 200a at 220b, and memory cell 200a in the crystalline state at 220a. Memory cell 200a at 220d is at the highest resistance state. In other embodiments, memory cell 200a can be programmed into any suitable number of resistance values or states. Memory cell 200b can be programmed similarly to memory cell 200a into any suitable number of resistance values or states.

Figure 9:
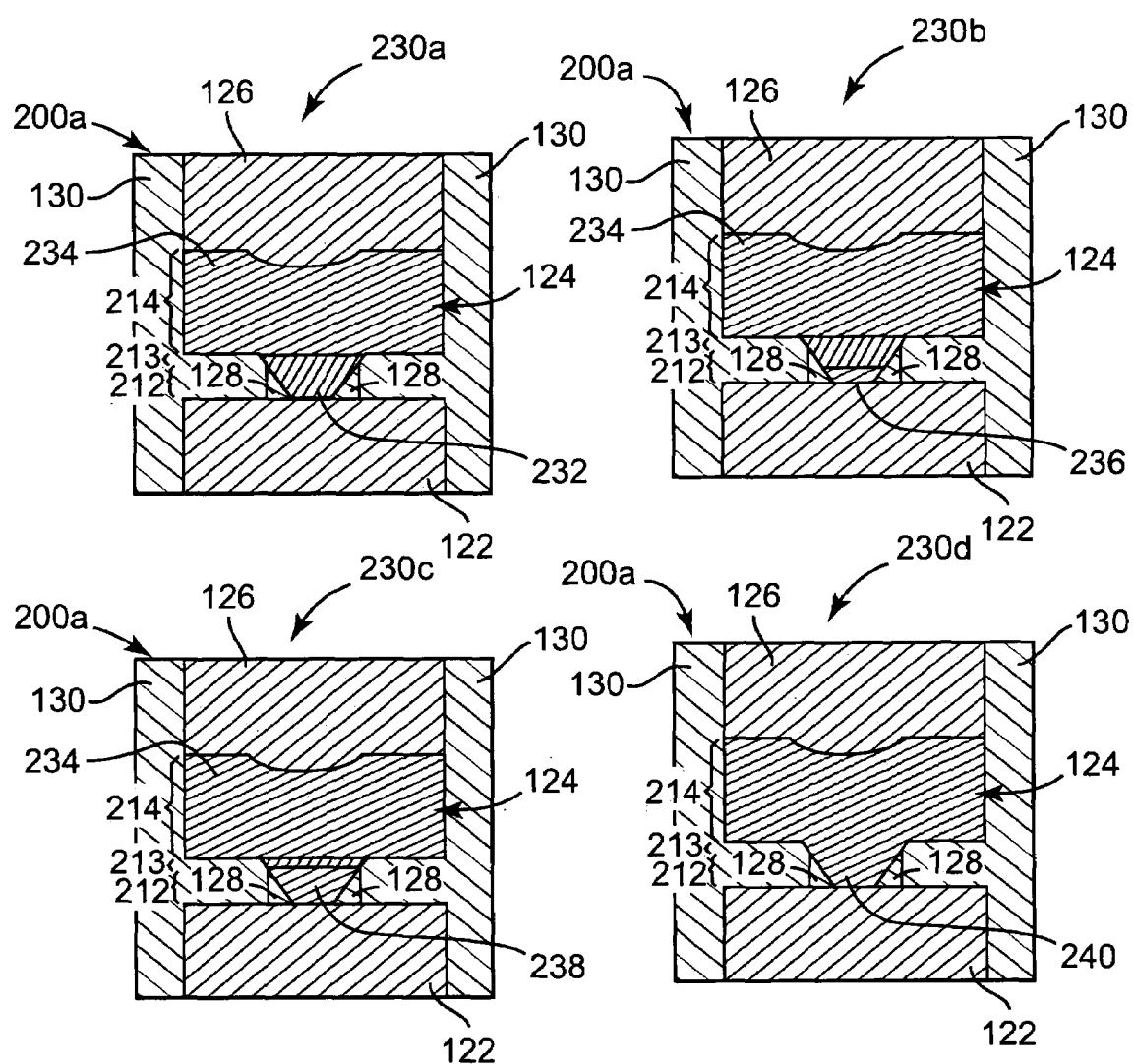
FIG. 9 illustrates a cross-sectional view of another embodiment of a phase-change memory cell in four different states.

FIG. 9 illustrates a cross-sectional view of another embodiment of memory cell 200a in four different states at 230a, 230b, 230c, and 230d. Phase-change material 124 is programmed into one of four states to store two bits of data. A selection device, such as an active device like a transistor or diode, is coupled to first electrode 122 to control the application of pulses to phase-change material 124. The pulses reset phase-change material 124 and program the other three states into phase-change material 124.

At 230b, a small bottom region 236 of phase-change material 124 has been programmed to change the resistance through phase-change material 124 and memory cell 200a. At 230c, a medium sized bottom region 238 of phase-change material 124 has been programmed to change the resistance through phase-change material 124 and memory cell 200a. At 230d, a large bottom region 240, which is all of phase-change material 124 of first portion 212, has been programmed to change the resistance through phase-change material 124 and memory cell 200a. The size of the programmed bottom region is related to the resistance through phase-change material 124 and memory cell 200a. The three different sized bottom region states at 230b-230d plus the initial state at 230a provide four states in phase-change material 124, and memory cell 200a provides a storage location for storing two bits of data. In one embodiment, the state of memory cell 200a at 230a is a "00", the state of memory cell 200a at 230b is a "01", the state of memory cell 200a at 230c is a "10", and the state of memory cell 200a at 230d is a "11".

At 230a, phase-change material 124 of first portion 212 is reset to a substantially amorphous state 232. During a reset operation of memory cell 200a, a reset pulse is selectively enabled by the selection device and sent through first electrode 122 and phase-change material 124. The reset pulse heats first portion 212 of phase-change material 124 above its melting temperature and first portion 212 of phase-change material 124 is quickly cooled to achieve the substantially amorphous state at 230a. After a reset operation, phase-change material 124 includes crystalline state phase-change material at 234, and amorphous state phase-change material at 232. The substantially amorphous state of first portion 212 of phase-change material 124 at 230a is the highest resistance state of memory cell 200a.

To program phase-change material 124 into one of the other three states 230b-230d, one or more pulses are provided by a write pulse generator, such as write pulse generator 102. At 230b, one or more pulses are provided to program the small bottom region at 236 into a crystalline state. The crystalline state is less resistive than the amorphous state, and memory cell 200a at 230b has a lower resistance than memory cell 200a at 230a. At 230c, one or more pulses are provided to program the medium sized bottom region at 238 into a crystalline state. Since the medium sized bottom region at 238 is larger than the small bottom region at 236 and the crystalline state is less resistive than the amorphous state, memory cell 200a at 230c has a lower resistance than memory cell 200a at 230b and memory cell 200a at 230a. At 230d, one or more pulses are provided to program the large bottom region at 240 into the crystalline state. Since the large bottom region at 240 is larger than the medium sized bottom region at 238 and the crystalline state is less resistive than the amorphous state, memory cell 200a at 230d has a lower resistance than memory cell 200a at 230c, memory cell 200a at 230b, and memory cell 200a at 230a. Memory cell 200a at 230d is in the lowest resistance state. In other embodiments, memory cell 200a can be programmed into any suitable number of resistance values or states. Memory cell 200b can be programmed similarly to memory cell 200a into any suitable number of resistance values or states.

Figure 10A:
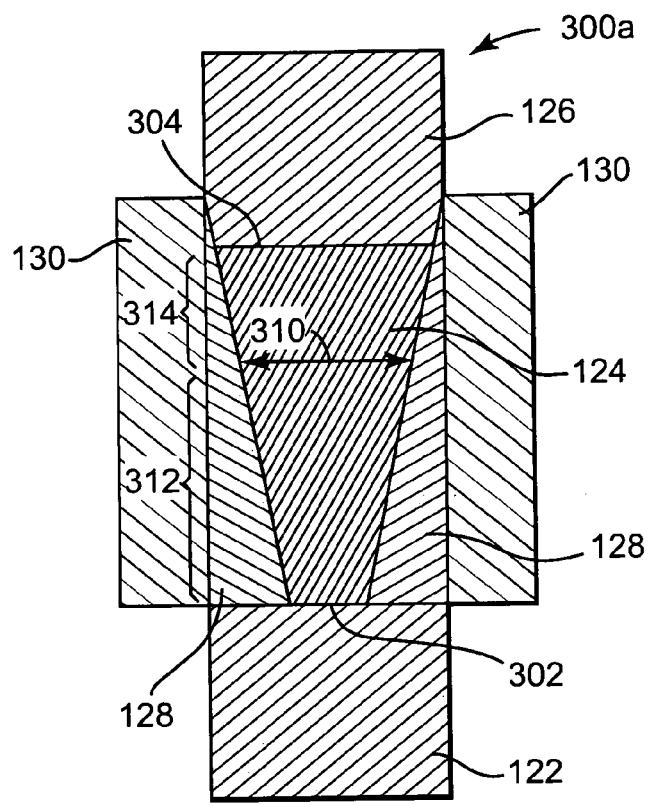
FIG. 10A illustrates a cross-section view of another embodiment of a phase-change memory cell.

FIG. 10A illustrates a cross-sectional view of another embodiment of a phase-change memory cell 300a. In one embodiment, phase-change memory cell 300a is a tapered via phase-change memory cell. Phase-change memory cell 300a includes first electrode 122, phase-change material 124, second electrode 126, first insulation material 128, and second insulation material 130. First insulation material 128 has a lower thermal conductivity than second insulation material 130. Phase-change material 124 provides a storage location for storing one bit, two bits, or several bits of data. In one embodiment, each of the memory cells 106a-106d is similar to phase-change memory cell 300a.

Phase-change material 124 includes a first portion 312 in contact with first electrode 122 at 302 and a second portion 314 in contact with second electrode 126 at 304. First portion 312 of phase-change material 124 has a maximum width at 310 and a minimum width at 302. Second portion 314 of phase-change material 124 has a maximum width at 304 and a minimum width at 310. In one embodiment, phase-change material 124 is tapered or forms a V shape. Phase-change material 124 is laterally completely enclosed by first insulation material 128, which defines the current path and hence the location of the phase-change region in phase-change material 124.

Figure 10B:
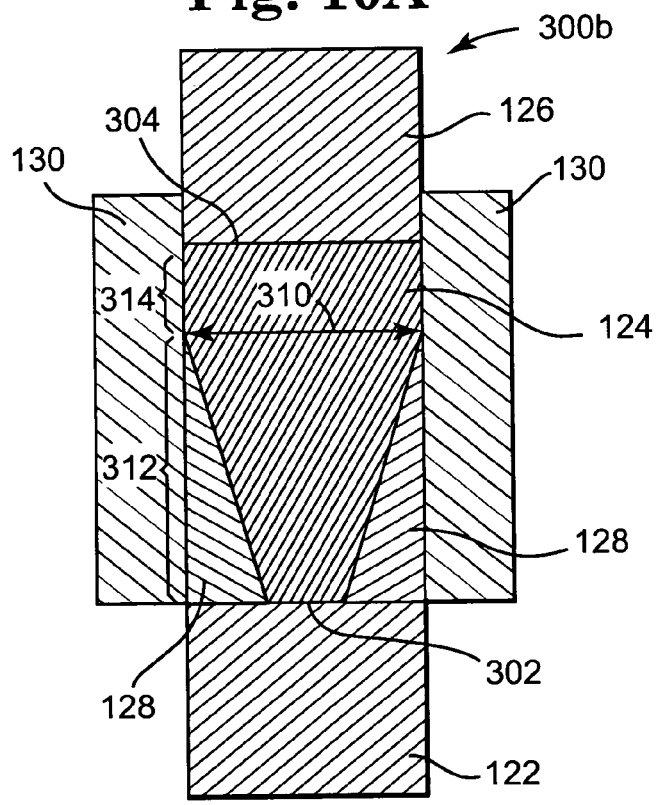
FIG. 10B illustrates a cross-sectional view of another embodiment of a phase-change memory cell.

FIG. 10B illustrates a cross-sectional view of another embodiment of a phase-change memory cell 300b. Phase-change memory cell 300b is similar to phase-change memory cell 300a except that second portion 314 of phase-change material 124 is laterally completely enclosed by second insulation material 130 and first portion 212 of phase-change material 124 is laterally completely enclosed by first insulation material 128, which defines the current path and hence the location of the phase-change region in phase-change material 124.

Figure 11:
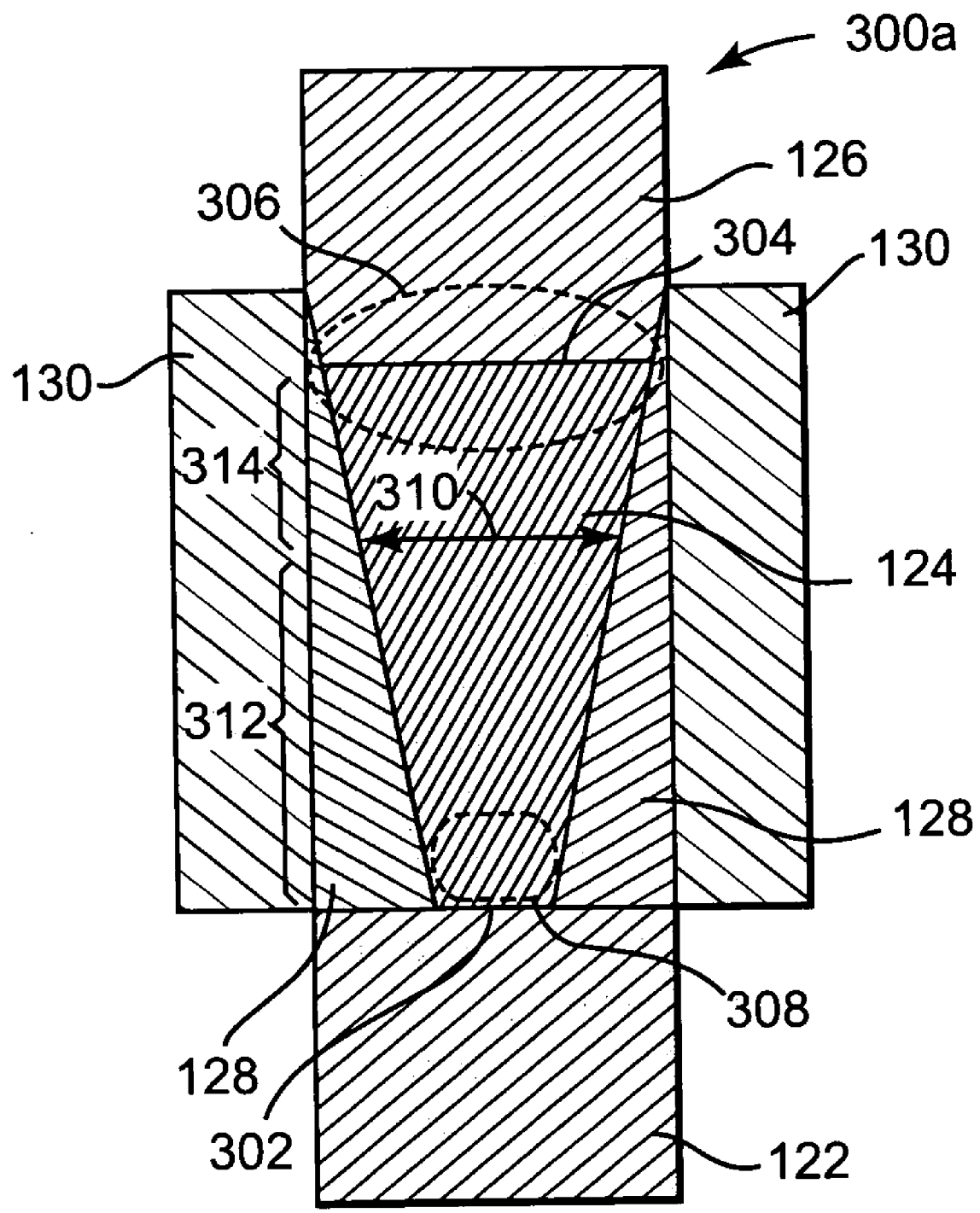
FIG. 11 illustrates a cross-sectional view of another embodiment of a phase-change memory cell including the identification of a temperature distribution during a write operation.

FIG. 11 illustrates a cross-sectional view of one embodiment of phase-change memory cell 300a including the identification of a temperature distribution during a write operation. During operation, a write pulse is applied between first electrode 122 and second electrode 126 to program phase-change memory cell 300a. Since first insulation material 128 has a lower thermal-conductivity than second insulation material 130 and phase-change material 124 is tapered or V shaped, the highest temperature within phase-change material 124 during a write pulse is at bottom portion 308. The temperature decreases from bottom portion 308 to upper portion 306. The tapered or V shape of phase-change material 124 in combination with the low heat capacitance/conductance of first insulation material layer 128 and the high heat capacitance/conductance of second insulation material layer 130 creates a controlled heat gradient along phase-change memory cell 300a during the application of write pulses to phase-change memory cell 300a.

Due to the improved thermal isolation around bottom portion 308 of phase-change material 124, and a comparatively poor thermal isolation at upper portion 306, a strong temperature gradient along the vertical cell axis of phase-change memory material 124 is created during both set and reset operations. This effect is enhanced because the highest current density for phase-change material 124 is also very close to bottom portion 308. This temperature gradient improves the control over the amount of crystallized or melted material, since to increase the amount of material affected by the phase change, significantly different (higher) pulse heights are used. A precise control over the amount of crystallized or melted material improves the distribution function for storing one bit, two bits, or several bits of data in phase-change memory cell 300a and 300b.

Figure 12:
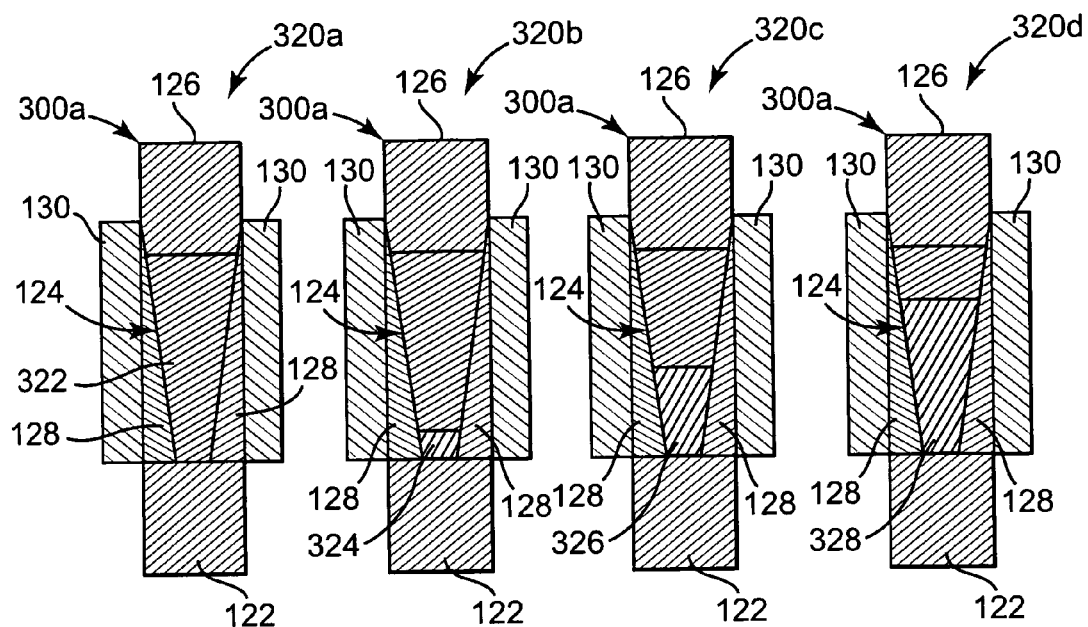
FIG. 12 illustrates a cross-sectional view of another embodiment of a phase-change memory cell in four different states.

FIG. 12 illustrates a cross-sectional view of one embodiment of memory cell 300a in four different states at 320a, 320b, 320c, and 320d. Phase-change material 124 is programmed into one of four states to store two bits of data. A selection device, such as an active device like a transistor or diode, is coupled to first electrode 122 to control the application of pulses to phase-change material 124. The pulses set phase-change material 124 and program the other three states into phase-change material 124.

At 320b, a small bottom region 324 of phase-change material 124 in memory cell 300a has been programmed to change the resistance through phase-change material 124 and memory cell 300a. At 320c, a medium sized bottom region 326 of phase-change material 124 in memory cell 300a has been programmed to change the resistance through phase-change material 124 and memory cell 300a. At 320d, a large bottom region 328 of phase-change material 124 in memory cell 300a has been programmed to change the resistance through phase-change material 124 and memory cell 300a. The size of the bottom region is related to the resistance through phase-change material 124 and memory cell 300a. The three different sized bottom region states at 320b-320d plus the initial state at 320a provide four states in phase-change material 124, and memory cell 300a provides a storage location for storing two bits of data. In one embodiment, the state of memory cell 300a at 320a is a "00", the state of memory cell 300a at 320b is a "01", the state of memory cell 300a at 320c is a "10", and the state of memory cell 300a at 320d is a "11".

At 320a, phase-change material 124 is set to a crystalline state 322. During a set operation of memory cell 300a, a set pulse is selectively enabled to first electrode 122 thereby heating phase-change material 124 above its crystallization temperature, but below its melting temperature. In this way, essentially all of phase-change material 124 reaches a crystalline state 322 during the set operation. Memory cell 300a is in the crystalline state at 320a, which is the lowest resistance state.

To program phase-change material 124 into one of the other three states 320b-320d, one or more pulses are provided by a write pulse generator, such as write pulse generator 102. At 320b, one or more pulses are provided to program the small bottom region at 324 into an amorphous state. The amorphous state is more resistive than the crystalline state, and memory cell 300a at 320b has a higher resistance than memory cell 300a in the crystalline state at 320a. At 320c, one or more pulses are provided to program the medium sized bottom region at 326 into an amorphous state. Since the medium sized bottom region at 326 is larger than the small bottom region at 324 and the amorphous state is more resistive than the crystalline state, memory cell 300a at 320c has a higher resistance than memory cell 300a at 320b and memory cell 300a in the crystalline state at 320a. At 320d, one or more pulses are provided to program the large bottom region at 328 into the amorphous state. Since the large bottom region at 328 is larger than the medium sized bottom region at 326 and the amorphous state is more resistive than the crystalline state, memory cell 300a at 320d has a higher resistance than memory cell 300a at 320c, memory cell 300a at 320b, and memory cell 300a in the crystalline state at 320a. Memory cell 300a at 320d is at the highest resistance state. In other embodiments, memory cell 300a can be programmed into any suitable number of resistance values or states. Memory cell 300b can be programmed similarly to memory cell 300a into any suitable number of resistance values or states. In another embodiment, the exact location of the bottom region can also be a slightly higher position leaving a certain distance from first electrode 122, since the combination of maximum current density but also cooling through first electrode 122 may result in a slightly shifted position of the point with maximum temperature.

Figure 13:
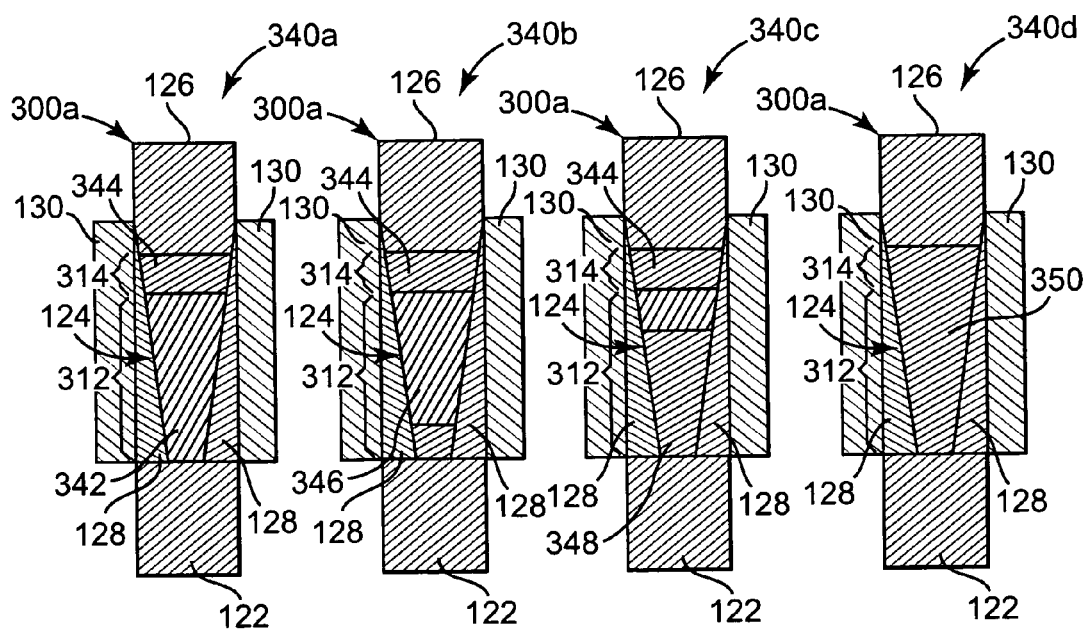
FIG. 13 illustrates a cross-sectional view of another embodiment of a phase-change memory cell in four different states.

FIG. 13 illustrates a cross-sectional view of another embodiment of memory cell 300a in four different states at 340a, 340b, 340c, and 340d. Phase-change material 124 is programmed into one of four states to store two bits of data. A selection device, such as an active device like a transistor or diode, is coupled to first electrode 122 to control the application of pulses to phase-change material 124. The pulses reset phase-change material 124 and program the other three states into phase-change material 124. At 340b, a small bottom region 346 of phase-change material 124 has been programmed to change the resistance through phase-change material 124 and memory cell 300a. At 340c, a medium sized bottom region 348 of phase-change material 124 has been programmed to change the resistance through phase-change material 124 and memory cell 300a. At 340d, a large bottom region 350, which is substantially all of phase-change material 124, has been programmed to change the resistance through phase-change material 124 and memory cell 300a. The size of the programmed bottom region is related to the resistance through phase-change material 124 and memory cell 300a. The three different sized bottom region states at 340b-340d plus the initial state at 340a provide four states in phase-change material 124, and memory cell 300a provides a storage location for storing two bits of data. In one embodiment, the state of memory cell 300a at 340a is a "00", the state of memory cell 300a at 340b is a "01", the state of memory cell 300a at 340c is a "10", and the state of memory cell 300a at 340d is a "11".

At 340a, phase-change material 124 of first portion 312 is reset to a substantially amorphous state 342. During a reset operation of memory cell 300a, a reset pulse is selectively enabled by the selection device and sent through first electrode 122 and phase-change material 124. The reset pulse heats first portion 312 of phase-change material 124 above its melting temperature and first portion 312 of phase-change material 124 is quickly cooled to achieve the substantially amorphous state at 340a. After a reset operation, phase-change material 124 includes crystalline state phase-change material at 344 and amorphous state phase-change material at 342. The substantially amorphous state of first portion 312 of phase-change material 124 at 340a is the highest resistance state of memory cell 300a. In another embodiment, there may also be a remaining small sliver of crystalline material between first electrode 122 and the amorphous state phase-change material at 342.

To program phase-change material 124 into one of the other three states 340b-340d, one or more pulses are provided by a write pulse generator, such as write pulse generator 102. At 340b, one or more pulses are provided to program the small bottom region at 346 into a crystalline state. The crystalline state is less resistive than the amorphous state, and memory cell 300a at 340b has a lower resistance than memory cell 300a at 340a. At 340c, one or more pulses are provided to program the medium sized bottom region at 348 into a crystalline state. Since the medium sized bottom region at 348 is larger than the small bottom region at 346 and the crystalline state is less resistive than the amorphous state, memory cell 300a at 340c has a lower resistance than memory cell 300a at 340b and memory cell 300a at 340a. At 340d, one or more pulses are provided to program the large bottom region at 350 into the crystalline state. Since the large bottom region at 350 is larger than the medium sized bottom region at 348 and the crystalline state is less resistive than the amorphous state, memory cell 300a at 340d has a lower resistance than memory cell 300a at 340c, memory cell 300a at 340b, and memory cell 300a at 340a. Memory cell 300a at 340d is in the lowest resistance state. In other embodiments, memory cell 300a can be programmed into any suitable number of resistance values or states. Memory cell 300b can be programmed similarly to memory cell 300a into any suitable number of resistance values or states.

Figure 14A:
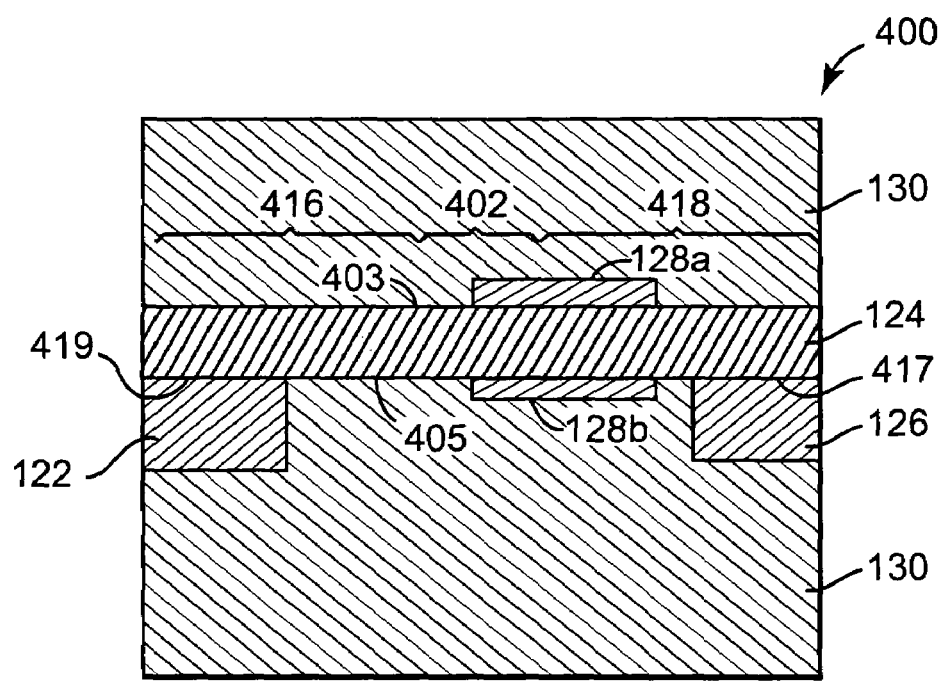
FIG. 14A illustrates a cross-sectional view of another embodiment of a phase-change memory cell.
Figure 14B:
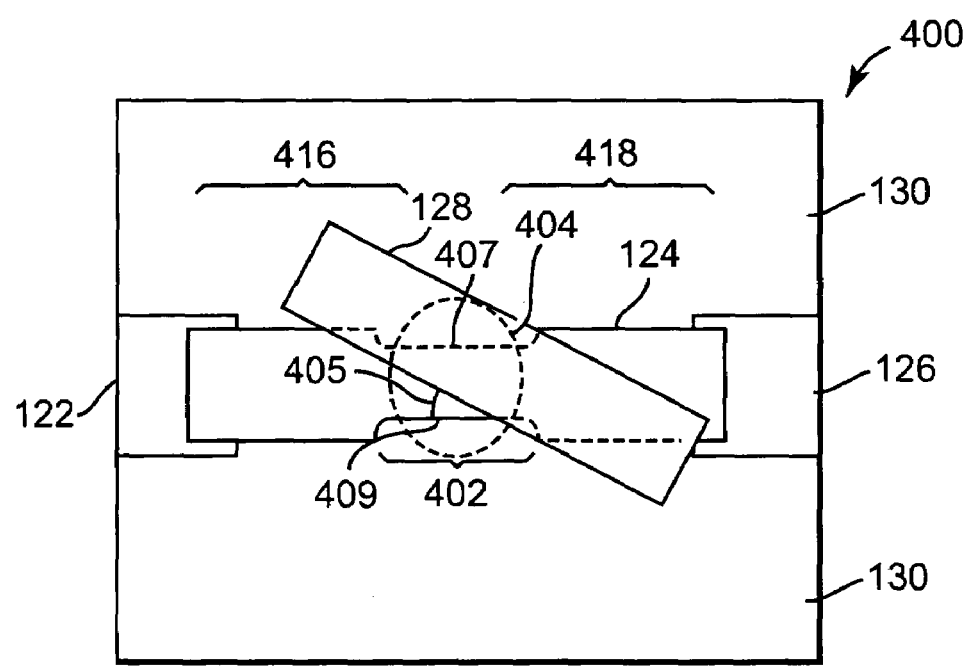
FIG. 14B illustrates a top view of one embodiment of a phase-change memory cell.

FIG. 14A illustrates a cross-sectional view of another embodiment through the center of a phase-change memory cell 400. In one embodiment, phase-change memory cell 400 is a line device phase-change memory cell. FIG. 14B illustrates a top view of one embodiment of phase-change memory cell 400. Phase-change memory cell 400 includes first electrode 122, phase-change material 124, second electrode 126, first insulation material 128a and 128b, and second insulation material 130. First insulation material 128a and 128b has a lower thermal conductivity than second insulation material 130. Phase-change material 124 provides a storage location for storing one bit, two bits, or several bits of data. In one embodiment, each of the memory cells 106a-106d is similar to phase-change memory cell 400.

Phase-change material 124 includes a first portion 416 in contact with first electrode 122 at 419, a second portion 418 in contact with second electrode 126 at 417, and a third portion 402 between first portion 416 and second portion 418. In one embodiment, third portion 402 of phase-change material 124 is narrower or has a smaller cross-section than first portion 416 and second portion 418. Phase-change material layer 124 is enclosed by second insulation material 130 and one or two layers of first insulation material 128 above and/or below phase-change material layer 124. A first layer 128a of first insulation material 128 contacts top surface 403 of phase-change material layer 124 and intersects phase-change material layer 124 diagonally at an acute angle 405 at the center of third portion 402 of phase-change material 124. An optional second layer 128b of first insulation material 128 contacts bottom surface 405 of phase-change material layer 124 and is directly opposite first layer 128a.

During operation, a write pulse is applied between first electrode 122 and second electrode 126 to program phase-change memory cell 400. Since insulation material 128 has a lower thermal conductivity compared to insulation material 130 and third portion 402 of phase-change material 124 in one embodiment is narrower than first portion 416 and second portion 418, the highest temperature within phase-change material 124 during a write pulse is at the top 407 of third portion 402. The temperature decreases from top 407 to bottom 409 of third portion 402. The shape of phase-change material 124 in combination with the low heat capacitance/ conductance of first insulation material 128 and the high heat capacitance/conductance of second insulation material 130 creates a controlled heat gradient within phase-change memory cell 400 during the application of write pulses to phase-change memory cell 400.

Due to the improved thermal isolation around top 407 of third portion 402 of phase-change material 124, and a comparatively poor thermal isolation around bottom 409 of third portion 402, a strong temperature gradient along the horizontal cell axis through the third portion 402 is created during both set and reset operations. This temperature gradient improves the control over the amount of crystallized or melted material, since to increase the amount of material affected by the phase change, significantly different (higher) pulse heights are used. A precise control over the amount of crystallized or melted material improves the distribution function for storing one bit, two bits, or several bits of data in phase-change memory cell 400.

Figure 15:
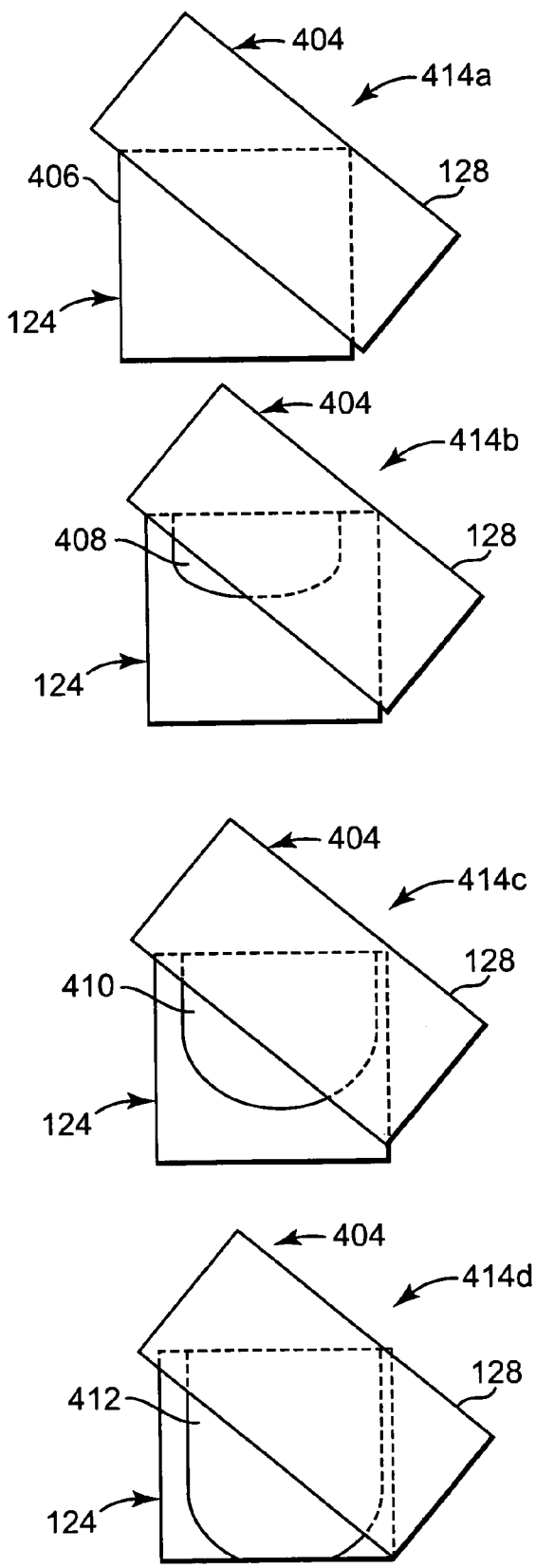
FIG. 15 illustrates a top view of one embodiment of a phase-change memory cell in four different states.

FIG. 15 illustrates a top view of one embodiment of center portion 404 of memory cell 400 in four different states at 414a, 414b, 414c, and 414d. Phase-change material 124 is programmed into one of four states to store two bits of data. A selection device, such as an active device like a transistor or diode, is coupled to first electrode 122 to control the application of pulses to phase-change material 124. The pulses set phase-change material 124 and program the other three states into phase-change material 124.

At 414b, a small region 408 of phase-change material 124 in memory cell 400 has been programmed to change the resistance through phase-change material 124 and memory cell 400. At 414c, a medium sized region 410 of phase-change material 124 in memory cell 400 has been programmed to change the resistance through phase-change material 124 and memory cell 400. At 414d, a large region 412 of phase-change material 124 in memory cell 400 has been programmed to change the resistance through phase-change material 124 and memory cell 400. The size of the region is related to the resistance through phase-change material 124 and memory cell 400. The three different sized region states at 414b-414d plus the initial state at 414a provide four states in phase-change material 124, and memory cell 400 provides a storage location for storing two bits of data. In one embodiment, the state of memory cell 400 at 414a is a "00", the state of memory cell 400 at 414b is a "01", the state of memory cell 400 at 414c is a "10", and the state of memory cell 400 at 414d is a "11".

At 414a, phase-change material 124 is set to a crystalline state 406. During a set operation of memory cell 400, a set pulse is selectively enabled to first electrode 122 thereby heating phase-change material 124 above its crystallization temperature, but below its melting temperature. In this way, essentially all of phase-change material 124 in third portion 402 reaches a crystalline state 406 during the set operation. Memory cell 400 is in the crystalline state at 414a, which is the lowest resistance state.

To program phase-change material 124 into one of the other three states 414b-414d, one or more pulses are provided by a write pulse generator, such as write pulse generator 102. At 414b, one or more pulses are provided to program the small region at 408 into an amorphous state. The amorphous state is more resistive than the crystalline state, and memory cell 400 at 414b has a higher resistance than memory cell 400 in the crystalline state at 414a. At 414c, one or more pulses are provided to program the medium sized region at 410 into an amorphous state. Since the medium sized region at 410 is larger than the small region at 408 and the amorphous state is more resistive than the crystalline state, memory cell 400 at 414c has a higher resistance than memory cell 400 at 414b and memory cell 400 in the crystalline state at 414a. At 414d, one or more pulses are provided to program the large region at 412 into the amorphous state. Since the large region at 412 is larger than the medium sized region at 410 and the amorphous state is more resistive than the crystalline state, memory cell 400 at 414d has a higher resistance than memory cell 400 at 414c, memory cell 400 at 414b, and memory cell 400 in the crystalline state at 414a. Memory cell 400 at 414d is at the highest resistance state. In other embodiments, memory cell 400 can be programmed into any suitable number of resistance values or states.

Figure 16:
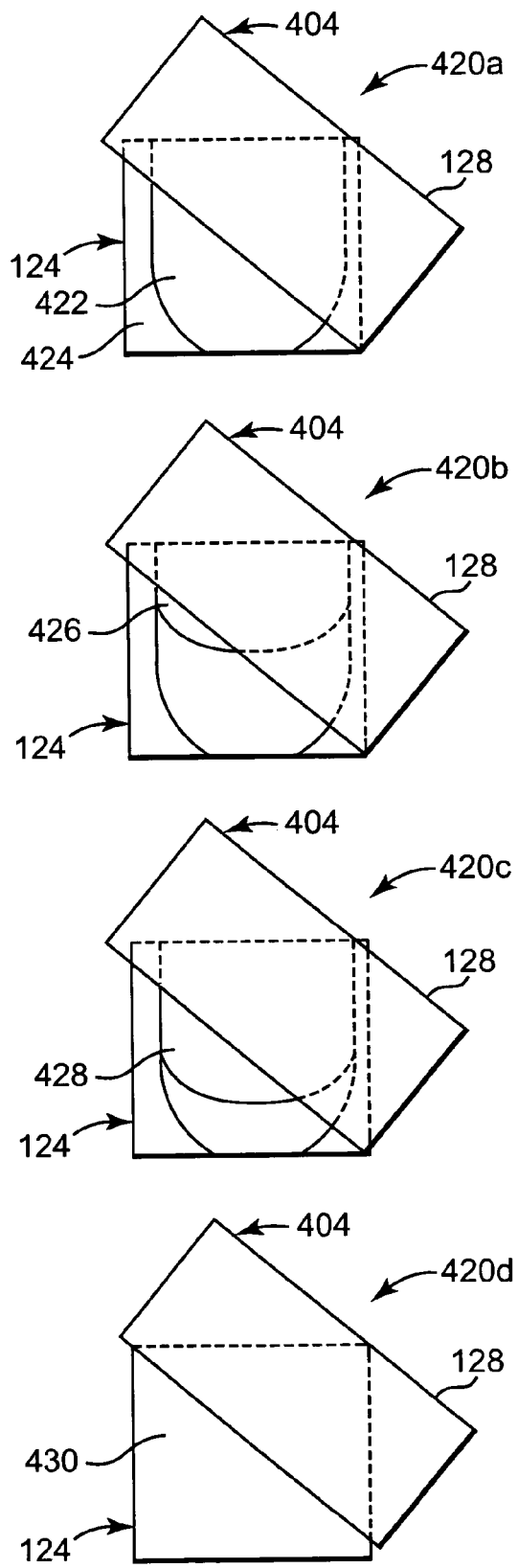
FIG. 16 illustrates a top view of another embodiment of a phase-change memory cell in four different states.

FIG. 16 illustrates a top view of another embodiment of center portion 404 of memory cell 400 in four different states at 420a, 420b, 420c, and 420d. Phase-change material 124 is programmed into one of four states to store two bits of data. A selection device, such as an active device like a transistor or diode, is coupled to first electrode 122 to control the application of pulses to phase-change material 124. The pulses reset phase-change material 124 and program the other three states into phase-change material 124.

At 420b, a small region 426 of phase-change material 124 has been programmed to change the resistance through phase-change material 124 and memory cell 400. At 420c, a medium sized region 428 of phase-change material 124 has been programmed to change the resistance through phase-change material 124 and memory cell 400. At 420d, a large region 430, which is substantially all of phase-change material 124 in center portion 404, has been programmed to change the resistance through phase-change material 124 and memory cell 400. The size of the programmed region is related to the resistance through phase-change material 124 and memory cell 400. The three different sized middle region states at 420b-420d plus the initial state at 420a provide four states in phase-change material 124, and memory cell 400 provides a storage location for storing two bits of data. In one embodiment, the state of memory cell 400 at 420a is a "00", the state of memory cell 400 at 420b is a "01", the state of memory cell 400 at 420c is a "10", and the state of memory cell 400 at 420d is a "11".

At 420a, phase-change material 124 is reset to a substantially amorphous state 422. During a reset operation of memory cell 400, a reset pulse is selectively enabled by the selection device and sent through first electrode 122 and phase-change material 124. The reset pulse heats phase-change material 124 above its melting temperature and phase-change material 124 is quickly cooled to achieve the substantially amorphous state at 420a. After a reset operation, center portion 404 of phase-change material 124 includes crystalline state phase-change material at 424, and amorphous state phase-change material at 422. The substantially amorphous state at 420a is the highest resistance state of memory cell 400.

To program phase-change material 124 into one of the other three states 420b-420d, one or more pulses are provided by a write pulse generator, such as write pulse generator 102. At 420b, one or more pulses are provided to program the small region at 426 into a crystalline state. The crystalline state is less resistive than the amorphous state, and memory cell 400 at 420b has a lower resistance than memory cell 400 at 420a. At 420c, one or more pulses are provided to program the medium sized region at 428 into a crystalline state. Since the medium sized region at 428 is larger than the small region at 426 and the crystalline state is less resistive than the amorphous state, memory cell 400 at 420c has a lower resistance than memory cell 400 at 420b and memory cell 400 at 420a.

At 420*d*, one or more pulses are provided to program the large region at 430 into the crystalline state. Since the large region at 430 is larger than the medium sized region at 428 and the crystalline state is less resistive than the amorphous state, memory cell 400 at 420*d* has a lower resistance than memory cell 400 at 420*c*, memory cell 400 at 420*b*, and memory cell 400 at 420*a*. Memory cell 400 at 420*d* is in the lowest resistance state. In other embodiments, memory cell 400 can be programmed into any suitable number of resistance values or states.

Embodiments of the present invention provide phase-change memory cells for storing one bit, two bits, or several bits of data. The phase-change material of the phase-change memory cells are insulated with a first insulation material and a second insulation material having a thermal conductivity different from the thermal conductivity of the first insulation material layer. The shape of the phase-change material in combination with the location and quantities of the two insulation materials provides a temperature gradient across the phase-change material during a set or reset operation for controlling the programming of the phase-change memory cell to multiple states.

What is claimed is:

1. A memory cell comprising:
   a first electrode;
   a second electrode;
   phase-change material comprising a first portion contacting the first electrode, a second portion contacting the second electrode, and a third portion between the first portion and the second portion, a cross-section of the third portion less than a cross-section of the first portion and a cross-section of the second portion;
   first insulation material having a first thermal conductivity contacting the first portion, the second portion, and the third portion; and
   second insulation material having a second thermal conductivity greater than the first thermal conductivity, the second insulation material contacting the first insulation material.

2. The memory cell of claim 1, wherein the phase-change material is hourglass shaped.

3. The memory cell of claim 1, wherein the first insulation material comprises $SiO_2$ and the second insulation material comprises SiN.

4. The memory cell of claim 1, wherein the first insulation material comprises a low-k material and the second insulation material comprises $SiO_2$.

5. The memory cell of claim 1, wherein the phase-change material comprises a chalcogenide.

* * * * *